United States Patent
Tang et al.

(10) Patent No.: US 8,957,712 B2
(45) Date of Patent: Feb. 17, 2015

(54) MIXED SIGNAL TDC WITH EMBEDDED T2V ADC

(71) Applicant: QUALCOMM Incorporated, San Diego, CA (US)

(72) Inventors: Yi Tang, San Diego, CA (US); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/842,481

(22) Filed: Mar. 15, 2013

(65) Prior Publication Data

US 2014/0266353 A1 Sep. 18, 2014

(51) Int. Cl.
*H03L 7/06* (2006.01)
*H03M 1/50* (2006.01)
*H03L 7/099* (2006.01)

(52) U.S. Cl.
CPC ............... *H03M 1/50* (2013.01); *H03L 7/0991* (2013.01); *H03L 7/06* (2013.01)
USPC ............ 327/159; 327/148; 327/150; 327/141

(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 6,868,047 B2 | 3/2005 | Sartschev et al. | |
| 6,909,672 B2 | 6/2005 | Rao | |
| 6,956,422 B2 | 10/2005 | Reilly et al. | |
| 7,205,924 B2 | 4/2007 | Vemulapalli et al. | |
| 7,570,182 B2 | 8/2009 | Sheba et al. | |
| 7,859,442 B2 | 12/2010 | Daniels et al. | |
| 7,893,861 B2 * | 2/2011 | Bulzacchelli et al. | 341/166 |
| 8,064,293 B2 | 11/2011 | Tabatabaei | |
| 8,324,952 B2 | 12/2012 | Masters | |
| 2008/0218228 A1 * | 9/2008 | Masson | 327/157 |
| 2009/0073021 A1 * | 3/2009 | Lee et al. | 341/161 |
| 2010/0231233 A1 | 9/2010 | Dasnurkar | |
| 2010/0328130 A1 * | 12/2010 | Bulzacchelli et al. | 341/166 |
| 2011/0084863 A1 * | 4/2011 | Chiu et al. | 341/141 |
| 2011/0121886 A1 | 5/2011 | Jeon | |
| 2011/0164675 A1 | 7/2011 | Senoue et al. | |
| 2011/0260902 A1 | 10/2011 | Lee et al. | |
| 2013/0154741 A1 * | 6/2013 | Lee et al. | 330/260 |

\* cited by examiner

*Primary Examiner* — Brandon S Cole
(74) *Attorney, Agent, or Firm* — Patterson & Sheridan, L.L.P.

(57) ABSTRACT

A time-to-digital converter converts the difference between transition times of a reference clock signal and an oscillating signal to a digital signal whose value is proportional to the transitions timing difference. The time-to-digital converter includes an edge detector, a time-to-voltage converter, and an analog-to-digital converter. The edge detector is adapted to detect, during each period of the reference clock signal, the edge (transition) of the oscillating signal that is closest to the edge of the reference clock signal. The time-to-voltage converter is adapted to generate an analog signal proportional to a difference in time between the detected edge of the oscillating signal and the edge of the reference clock signal. The analog-to-digital converter is adapted to convert the analog signal to a digital signal whose value is proportional the difference between the occurrence of the detected edge of the oscillating signal and the edge of the reference clock signal.

80 Claims, 11 Drawing Sheets

MIXED SIGNAL TDC WITH EMBEDDED T2V ADC

BACKGROUND

The present disclosure relates to electronic circuits, and more particularly to a time-to-digital converter.

A time-to-digital converter (TDC) is an electronic circuit that converts the difference between transition times of two signals to a digital signal whose value is proportional to such timing difference. A time-to-digital converter may be used in a phase-locked loop to convert the difference between the transition times of a reference clock signal and an oscillating signal to a digital signal in order to lock the phase of the oscillating signal to the phase of the clock signal.

BRIEF SUMMARY

A time-to-digital converter converts the difference between transition times of a reference clock signal and an oscillating signal to a digital signal whose value is proportional to the transitions timing difference. The time-to-digital converter, in accordance with one embodiment of the present invention, includes an edge detector, a time-to-voltage converter, and an analog-to-digital converter.

The edge detector is adapted to detect, during each period of the reference clock signal, the edge (transition) of the oscillating signal that is closest to the edge of the reference clock signal. The time-to-voltage converter is adapted to generate an analog signal having a value proportional to the difference between the occurrences of the detected edge of the oscillating signal and the edge of the reference clock signal. The analog-to-digital converter is adapted to convert the analog signal to a digital signal.

In one embodiment, the time-to-digital converter has first and second differential outputs that are charged to a predefined voltage level in response to a reset signal. Thereafter, depending on the relative arrival times of the detected edge of the oscillating signal and the reference clock signals, one of the differential outputs is enable to charge to a higher voltage (or discharge to a lower voltage) while the other differential output remains at the same predefined voltage level. The longer the period between the arrival times of the two edges, the greater is the amount of voltage increase (or decrease). To achieve this, a conductive path is formed between the first differential output and a first supply voltage via first and second transistors if the edge of the reference clock signal leads the detected edge of the oscillating signal. Conversely, a conductive path is formed between the second differential output and the first supply voltage via third and fourth transistors if the edge of the reference clock signal lags the detected edge of the oscillating signal.

In one embodiment, the first differential output of the time-to-digital converter is charged to the predefined voltage level via a fifth transistor, and the second differential output of the time-to-digital converter is charged to the predefined voltage level via a sixth transistor. The predefined voltage level may be a second supply voltage.

In one embodiment, the fifth and sixth transistors are NMOS transistors and the second supply voltage is smaller than the first supply voltage. In one embodiment, the time-to-digital converter further includes, in part, first and second multitudes of capacitors. Each of the first multitude of capacitors is adapted to be coupled between the first differential output and the second supply voltage in response to a different one of a first multitude of control signals. Similarly, each of the second multitude of capacitors is adapted to be coupled between the second differential output and the second supply voltage in response to a different one of a second multitude of control signals.

In one embodiment, the analog-to-digital converter is a successive approximation register (SAR) analog-to-digital converter. In such embodiments, the first and second multitudes of capacitors are used for performing sample and hold operations for the SAR analog-to-digital converter. In such embodiments, the SAR analog-to-digital converter further includes a control logic adapted to generate the first and second multitudes of control signals.

In one embodiment, the analog-to-digital converter further includes a comparator adapted to compare voltages of the first and second differential outputs of the time-to-voltage converter and supply a comparison signal to the control logic. The control logic generates the output signal of the time-to-voltage converter.

In one embodiment, the edge detector includes a multitude of buffers and variable capacitors. By varying the capacitances of one or more of the variable capacitors, the delay across each of a subset of the buffers is adjusted to be substantially equal to a predefined fraction of a period of the oscillating signal. The edge detector further includes a multitude of flip-flops whose clock terminals receive the output signals of a number of the buffers.

A method of converting the difference between transition times of a reference clock signal and an oscillating signal to a digital signal includes, detecting—during each period of the reference clock signal—a transition of the oscillating signal closest in time to the transition of the reference clock signal, charging first and second differential outputs to a first supply voltage, forming a first conductive path between the first differential output and a second supply voltage in response to the transition of the reference clock signal during a first time period, forming a second conductive path between the second differential output and the second supply voltage in response to the detected edge of the oscillating signal during a second time period not overlapping the first time period, generating an analog signal proportional to the difference between such transition times, and digitizing the analog signal.

A digital control-locked loop includes, in part, a phase detector, a loop filter, a digitally-controlled oscillator, and a time-to-digital converter. The phase detector is adapted to detect the difference between the phase of a reference signal and the phase of a loop signal to generate a phase error signal. The loop filter is adapted to filter out high frequency components of noise from the phase error signal. The digitally controlled oscillator is adapted to generate an oscillating signal responsive to the filtered phase error signal. The time-to-digital converter converts the difference between transition times of a reference clock signal and the oscillating signal to a digital signal representing the loop signal.

BRIEF DESCRIPTION OF THE DRAWINGS

Aspects of the disclosure are illustrated by way of example. In the accompanying figures, like reference numbers indicate similar elements, and.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure.

Figure 1:
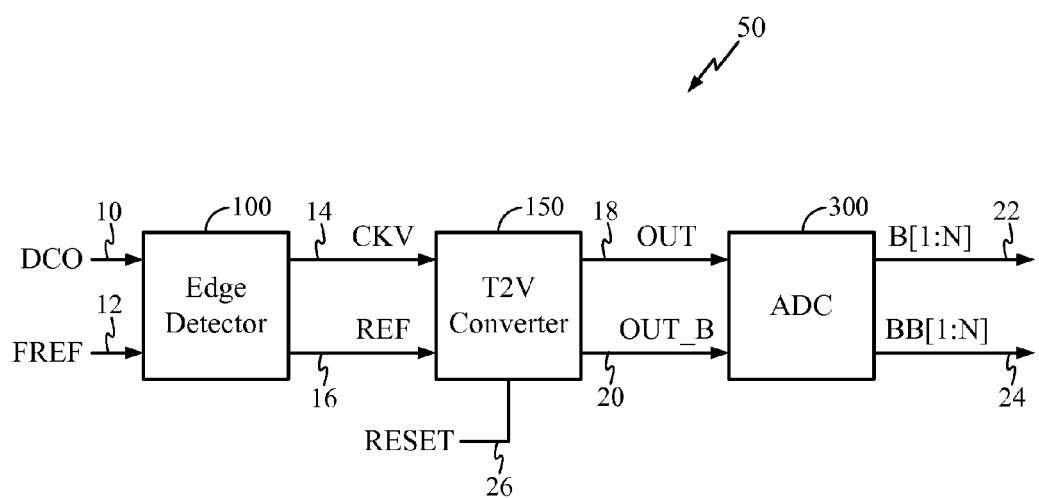
FIG. 1 is a block diagram of a time-to-digital converter, in accordance with one exemplary embodiment of the present invention.

FIG. 1 is a block diagram of a time-to-digital converter (TDC) 50, in accordance with one exemplary embodiment of the present invention. TDC 50 is shown as including, in part, an edge detector 100, a time-to-voltage converter (T2V) 150, and an analog-to-digital converter (ADC) 300.

Edge detector 100 is adapted to receive an oscillating signal DCO 10, and a reference clock signal FREF 12 that has a longer time period than signal DCO 10. Accordingly, during each period of signal FREF 12, a number of transitions (edges) occur on signal DCO 10. In one embodiment, during each period of signal FREF 12, edge detector 100 filters out all DCO 10 signal edges except the rising (or falling) DCO 10 edge that is closest in time to the rising (or falling) edge of signal FREF 12 in that period. The DCO 10 signal edge detected as being closest in time to the rising (or falling) edge of signal FREF 12 is supplied as output signal CKV 14. The corresponding edge of signal FREF 12 is supplied as output signal REF 16 by edge detector 100. In another embodiment, during each period of signal FREF 12, edge detector 100 may detect the second closest DCO 10 edge to the FREF 12 signal edge. In yet other embodiments, during each period, edge detector 100 detects the DCO 10 edge satisfying a predefined relationship to the FREF 12 edge. The detected DCO 10 edge in all such embodiments is supplied as output signal CKV 14.

T2V converter 150 is adapted to generate a voltage proportional to the difference in transition times (edges) of signals CKV 14 and REF 16. Accordingly, the longer is the time difference (delay) between transitions of signals CKV 14 and REF 16, the greater is the differential voltage generated across output nodes OUT 18 and OUT_B 20 of T2V converter 150. Signal RESET 26 is used to charge the voltage of output nodes OUT 18 and OUT_B 20 to predefined voltage levels, as is described further below. ADC 300 is adapted to convert the differential voltage it receives from output nodes OUT 18, OUT_B 20 to a pair of differential N-bit digital signals B[1:N] 22 and BB[1:N] 24. ADC 300 may be a successive approximation register (SAR) ADC.

Figure 2:
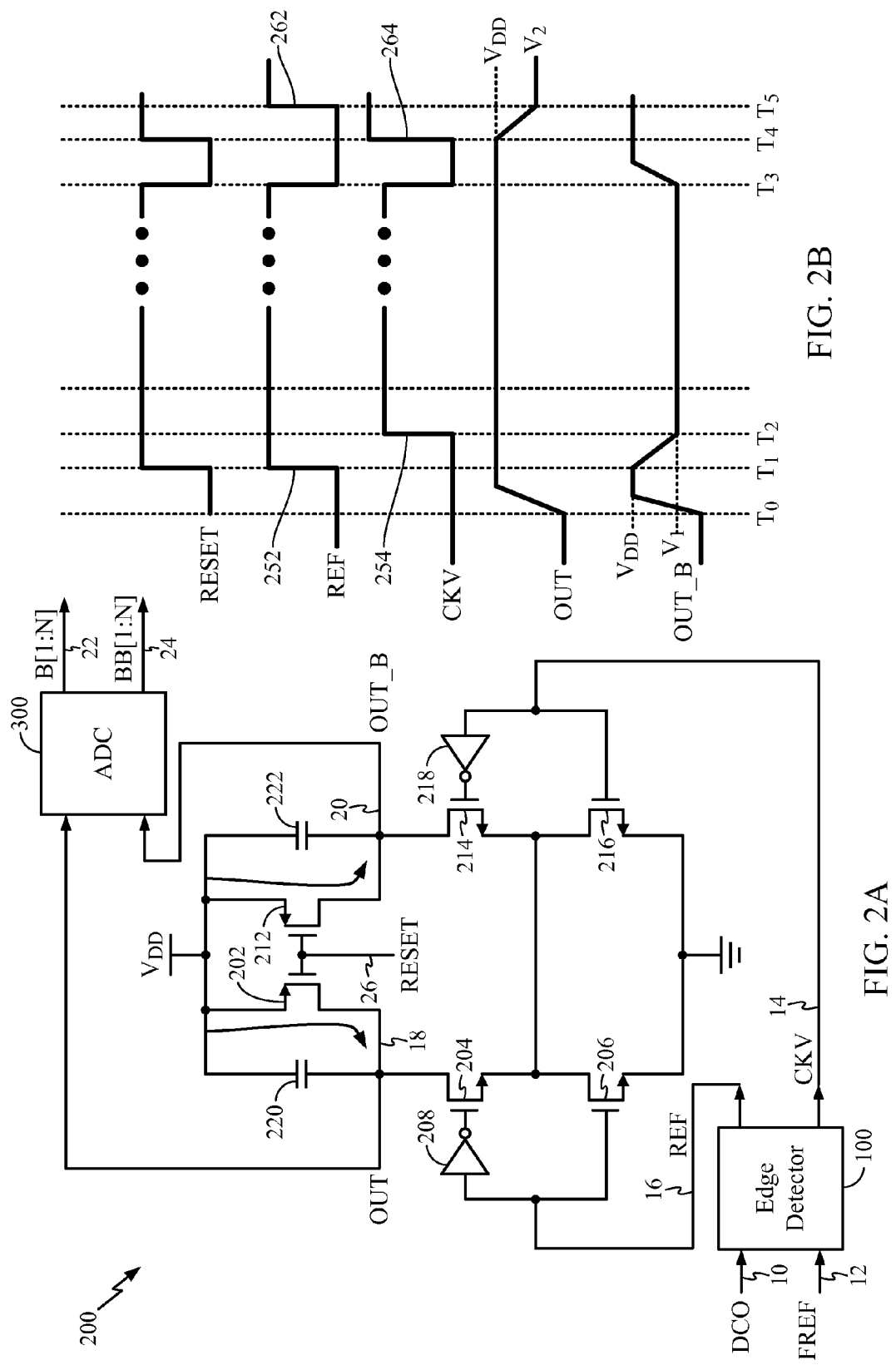
FIG. 2A is a schematic diagram of a time-to-digital converter, in accordance with one exemplary embodiment of the present invention.
FIG. 2B is a timing diagram of a number of signals associated with the time-to-voltage converter of FIG. 2A.

FIG. 2A is a schematic diagram of a TDC 75 having disposed therein a T2V converter 200, in accordance with one exemplary embodiment of the present invention. T2V 200, which is one embodiment of T2V 150 of FIG. 1, is shown as including transistors 202, 204, 206, 212, 214, 216, capacitors 220, 222, as well inverters 208 and 218. FIG. 2B is a timing diagram of a number of signals associated with T2V converter 200 of FIG. 2A.

Referring to FIGS. 2A and 2B concurrently, signal RESET 26 resets output nodes OUT 18 and OUT_B 20 to supply voltage VDD via PMOS transistors 202 and 212, respectively. Capacitors 220, 222 retain the charges stored at nodes OUT 18, OUT_B 20. In FIG. 2B, during the period (T0-T1), signal RESET 26 is shown as being low, thereby causing nodes OUT 18 and OUT_B 20 to be reset to supply voltage VDD.

If the rising edge of signal REF 16 arrives before the corresponding rising edge of signal CKV 14, transistors 214 and 206 turn on thus providing a conductive path from node OUT_B 20 to the ground, while the voltage at node OUT 18 remains at supply voltage VDD. In FIG. 2B, rising edge 252 of signal REF 16 occurs at time T1, and the rising edge of signal CKV 14 occurs at time T2. Because T1 occurs prior to T2, during the period (T2-T1), node OUT_B 20 is discharged from its high voltage level VDD to a lower voltage level V1 via transistors 214 and 206. However, because during the period (T2-T1), transistor 204 remains open, node OUT 18 remains at VDD. The drop in voltage level of node OUT_B 20 from VDD to V1 is dependent on the period (T2-T1). In other words, the longer the delay between the arrival of corresponding edges of signals REF and CKV, the greater is the drop in the voltage level of node OUT_B.

Likewise, If the rising edge of signal REF 16 arrives after the corresponding rising edge of signal CKV 14, transistors 204 and 216 turn on thus providing a conductive path from node OUT 18 to the ground, while the voltage at node OUT_B 20 remains at VDD. In FIG. 2B, reset signal RESET 26 is shown as being at a low level during the period (T4-T3), thus causing nodes OUT 18 and OUT_B 20 to be charged to supply voltage VDD. Following the reset operation, rising edge 262 of signals REF 16 is shown as occurring at time T5, whereas the rising edge of signal CKV 14 is shown as occurring at time T4. Because T5 occurs after T4, node OUT 18 is discharged from VDD to a lower voltage level V2. The drop in voltage level of node OUT 18 from VDD to V2 is dependent on the period (T5-T4). In other words, the longer is the delay between arrival times of the corresponding edges (i.e., transition times) of signals REF 16 and CKV 14, the greater is the drop in the voltage level of node OUT 18. As explained further below, the differential voltage across nodes OUT 18 and OUT_B 20 is converted to a digital signal by an analog-to-digital converter whose output voltage represents the output of the TDC.

Figure 3:
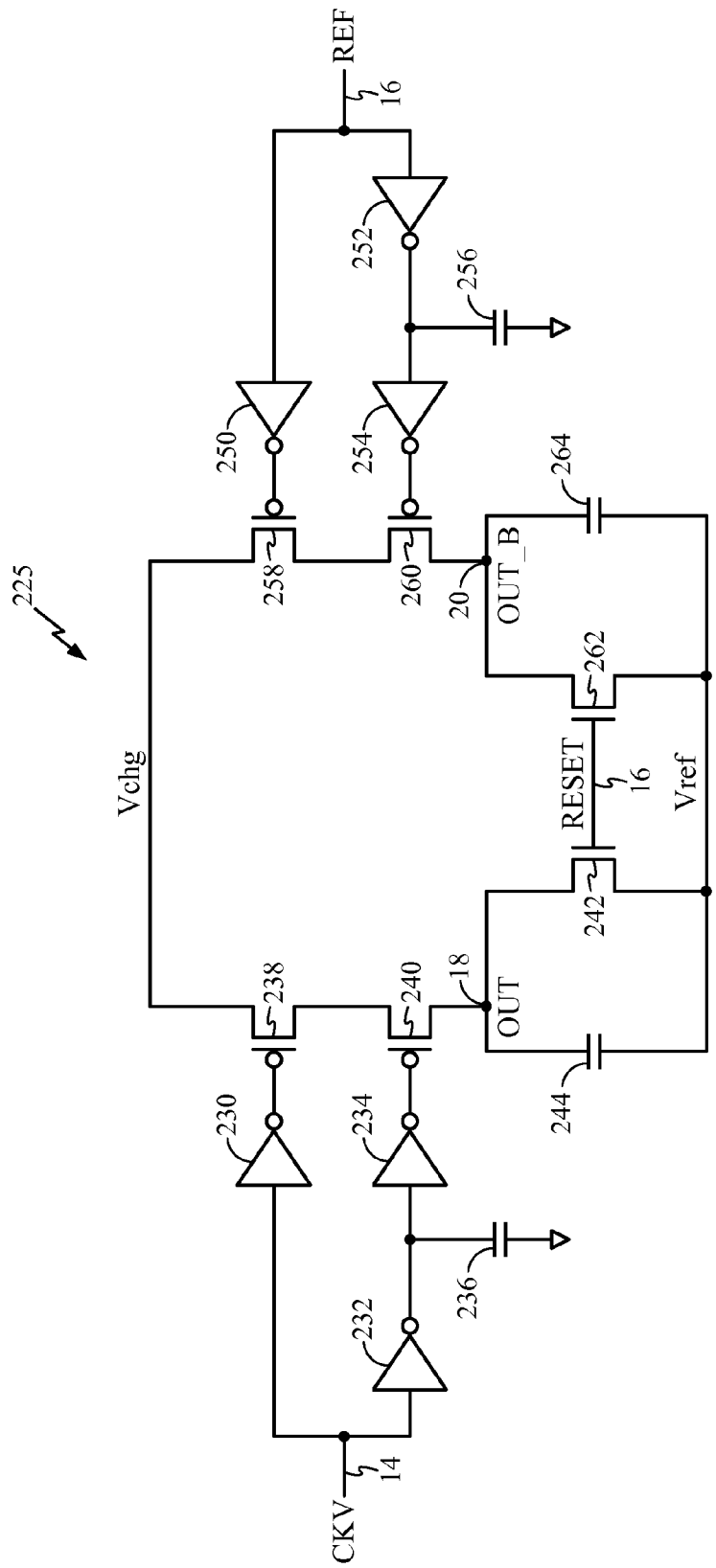
FIG. 3 is a schematic diagram of the time-to-voltage converter of FIG. 1, in accordance with another exemplary embodiment of the present invention.

FIG. 3 is a schematic diagram of a T2V converter 225, in accordance with another exemplary embodiment of the present invention. T2V 225, which is one embodiment of T2V 150 of FIG. 1, is shown as including transistors 238, 240, 242, 258, 260, 262, inverters 230, 232, 234, 250, 252, 254 and capacitors 236, 256.

T2V 225 operates in the same manner as T2V converter 200 except that in T2V converter 225, NMOS transistors 242 and 262 cause output nodes OUT 18 and OUT_B 20 to be charged to reference voltage Vref in response to reset signal RESET 16. After such a reset, either transistors 240, 258 are tuned on to form a conductive path from node OUT 18 to supply voltage Vchg, or conversely, transistors 260, 238 are tuned on to form a conductive path from node OUT_B 20 to supply voltage Vchg. In particular, depending on the relative timing of the rising edges of signals REF 16 and CKV 14, the voltage of one of the nodes OUT 18 or OUT_B 20 is enable to increase from Vref, while the voltage of the other node remains at Vref. The magnitude of this voltage increase is dependent on the difference between the arrival times of the corresponding edges of signals CKV 14 and REF 16.

If the rising edge of signal REF 16 arrives before the corresponding rising edge of signal CKV 14, transistors 240, 258 turn on to form a conductive path between node OUT 18 and supply voltage Vchg. Accordingly, the voltage of node OUT 18 is enabled to increase. The increase in the voltage level of node OUT 18 is dependent on the period defined by the difference in the arrival times of the rising edges of signal CKV 14 and REF 16. The greater this difference, the higher is the voltage increase at node OUT 18. Because transistors 260 and 238 remain off during this period, the voltage at node OUT_B 20 remains at voltage Vref. The difference in voltages of nodes OUT 18 and OUT_B 20 is converted to a digital signal representing the output voltage of the TDC. In one embodiment, Vref is the ground potential.

Likewise, if the rising edge of signal REF 16 arrives after the corresponding rising edge of signal CKV 14, transistors 260, 238 turn on to form a conductive path between node OUT_B 20 and supply voltage Vchg. Accordingly, the voltage of node OUT_B 20 is enabled to increase. The increase in the voltage level of node OUT_B 20 is dependent on the period defined by the difference in the arrival times of the rising edges of signal CKV 14 and REF 16. The greater this difference, the higher is the voltage increase at node OUT_B 20. Because transistors 240 and 258 remain off during such a period, the voltage at node OUT 18 remains at voltage Vref. The difference in voltages of nodes OUT 18 and OUT_B 20 is converted to a digital signal representing the output voltage of the TDC.

Figure 4:
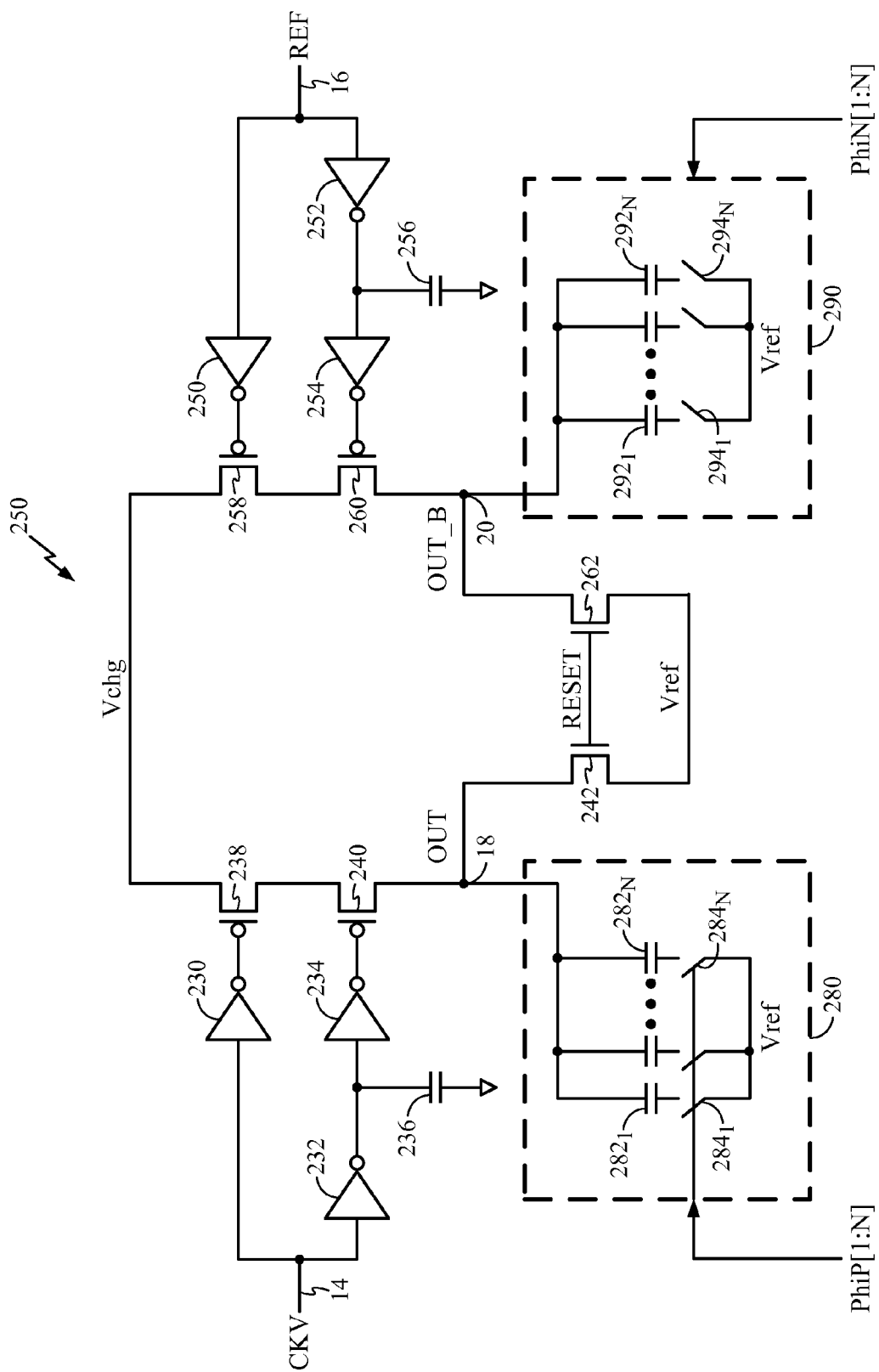
FIG. 4 is a schematic diagram of the time-to-voltage converter of FIG. 1, in accordance with one exemplary embodiment of the present invention.

FIG. 4 is a schematic diagram of a T2V converter 250, in accordance with another exemplary embodiment of the present invention. T2V converter 250, which is one embodiment of T2V converter 150 of FIG. 1, is similar to T2V converter 225 except that T2V converter 250 includes first and second capacitor banks 280, 290 in place of capacitors 244, 264. Capacitor banks 280 and 290 are parts of a successive approximation register (SAR) ADC. Accordingly, in such embodiments the capacitor banks of the ADC are integrated within the T2V circuitry.

Capacitor bank 280 includes N capacitors $282_i$ and N switches $284_i$, where i is an integer varying from 1 to N. A first terminal of each capacitor $282_i$ is coupled to node OUT 18. A second terminal of each capacitor $282_i$ is coupled to supply voltage Vref via an associated switch $284_i$ which opens or closes in response to one of the N bits of signal PhiP. In other words, the second terminal of capacitor $282_i$ receives voltage Vref when bit i of N-bit signal PhiP is asserted in order to close an associated switch $284_i$.

Similarly, capacitor bank 290 includes N capacitors $292_i$ and N switches $294_i$. A first terminal of each capacitor $292_i$ is coupled to node OUT_B 20. A second terminal of each capacitor $292_i$ is coupled to supply voltage Vref via an associated switch $294_i$ which opens or closes in response to one of the N bits of signal PhiN. In other words, the second terminal of capacitor $292_i$ receives Vref when bit i of N-bit signal PhiN is asserted in order to close an associated switch $294_i$. As described further below, the differential voltage across output nodes OUT 18, OUT_B 20 of capacitor banks 280, 290 is converted to a digital signal using an ADC.

Figure 5:
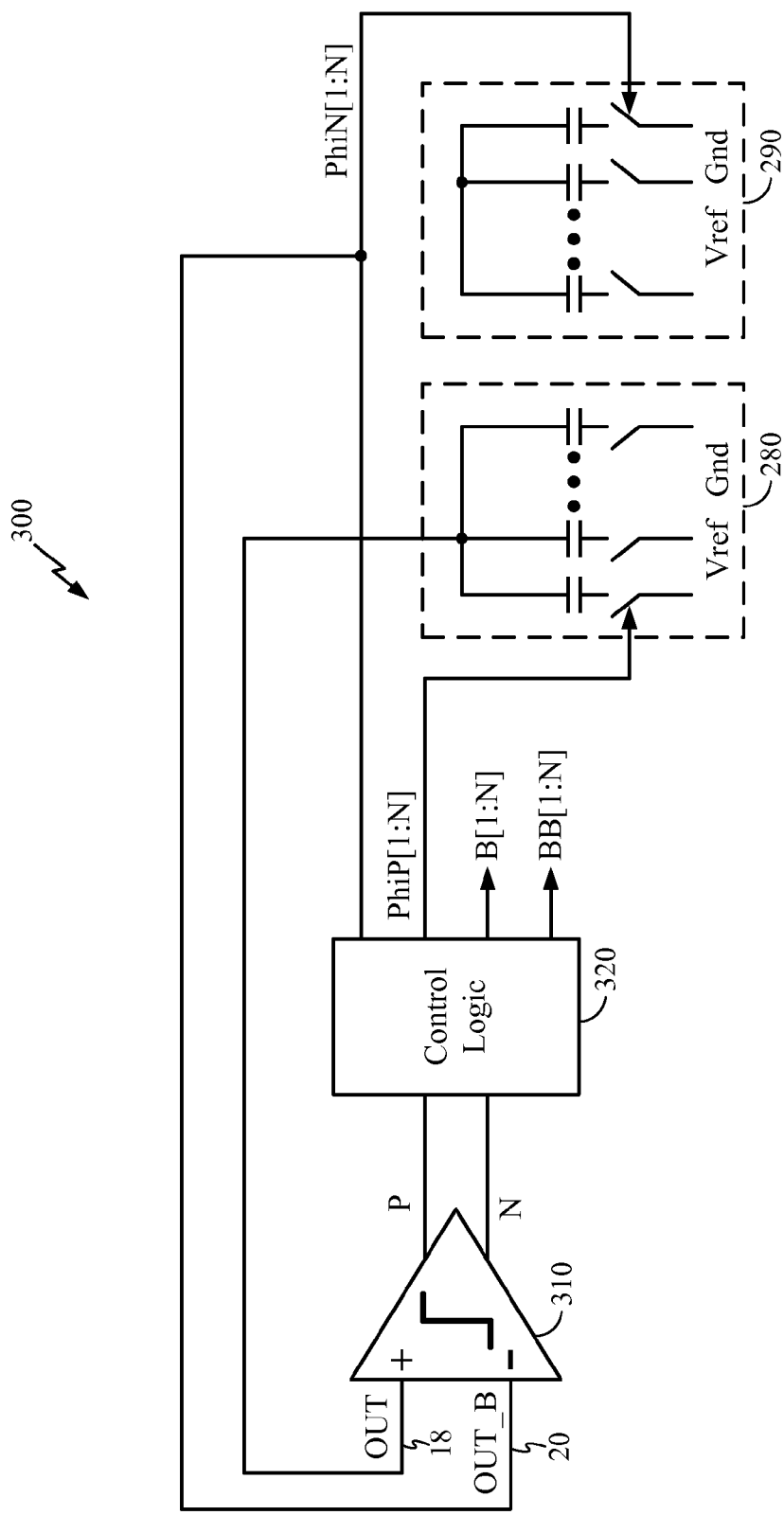
FIG. 5 is a simplified block diagram of the analog-to-digital converter of FIG. 1, in accordance with one exemplary embodiment of the present invention.

FIG. 5 is a simplified block diagram of ADC 300 of FIG. 1, in accordance with one exemplary embodiment of the present invention. Although ADC 300 of FIG. 5 is shown as being a SAR ADC, it is understood that ADC 300 may be any ADC. ADC 300 is adapted to convert the differential voltage supplied across nodes OUT 18, OUT_B 20 to an N-bit digital signal.

ADC 300 is shown as including comparator 310, control logic 320, and capacitor banks 280, 290, described above in reference to FIG. 4. Capacitors $282_i$ and $292_i$ of capacitor banks 280, 290 sample the voltages of nodes OUT 18, OUT_B 20, and hold these voltages for comparison by comparator 310. The output of comparator 310 is a rail-to-rail differential voltage supplied across the comparator's output terminals P, N. Control logic 320 is adapted to digitize the differential voltage appearing across output terminals P, N of comparator 310 to generate a pair of N-bit differential signals B[1:N] and BB[1:N] representing the output of the TDC. Differential signals PhiP[1:N] and PhiN[1:N] controlling switches $284_i$ and $294_i$ of capacitors banks 280, 290 are also generated by control logic 320.

Figures 6A, 6B:
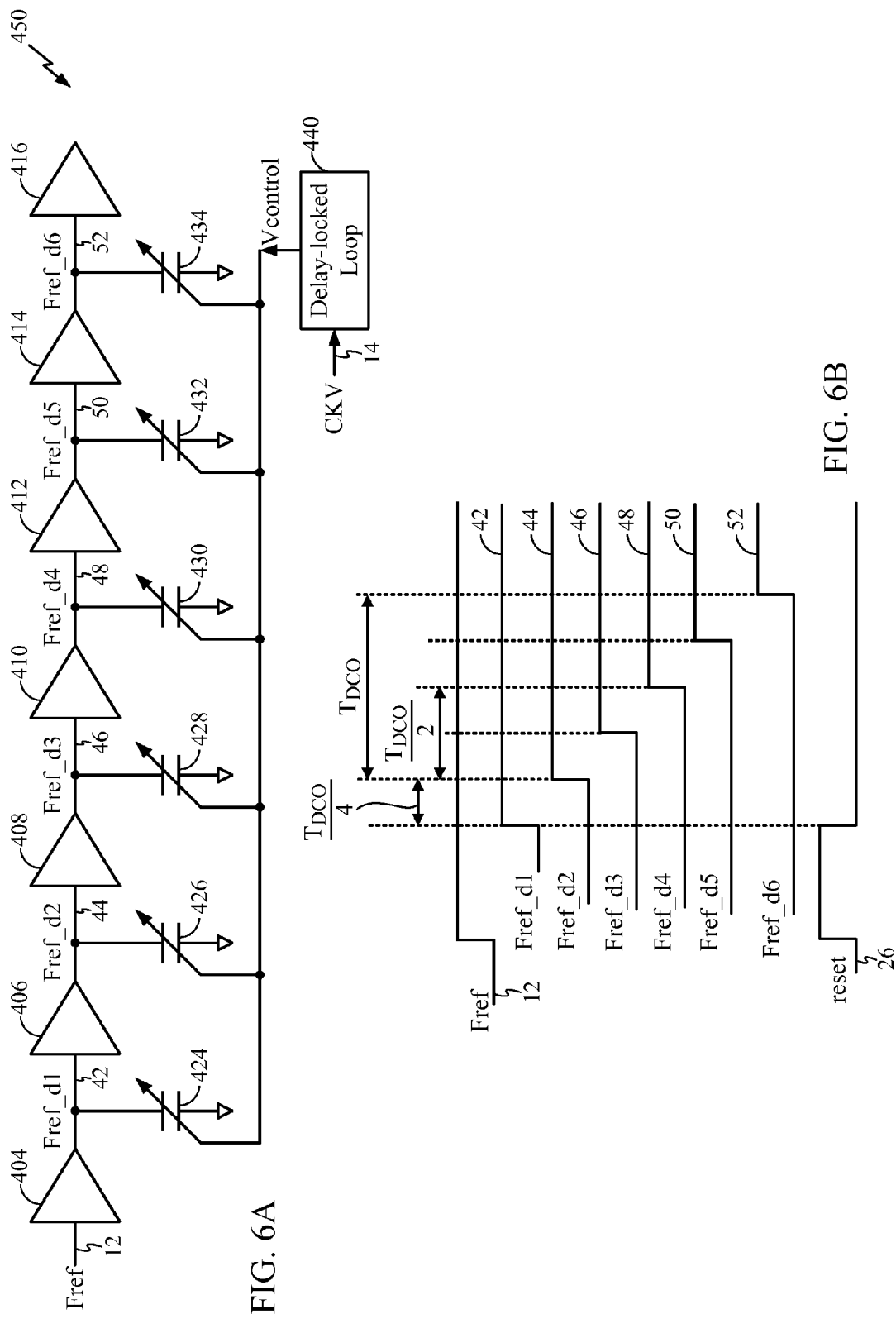
FIG. 6A is a schematic diagram of an adjustable delay chain disposed in the edge detector of FIG. 1, in accordance with one exemplary embodiment of the present invention.
FIG. 6B is a timing diagram of a number of signals associated with the adjustable delay chain of FIG. 6A.
Figure 7A:
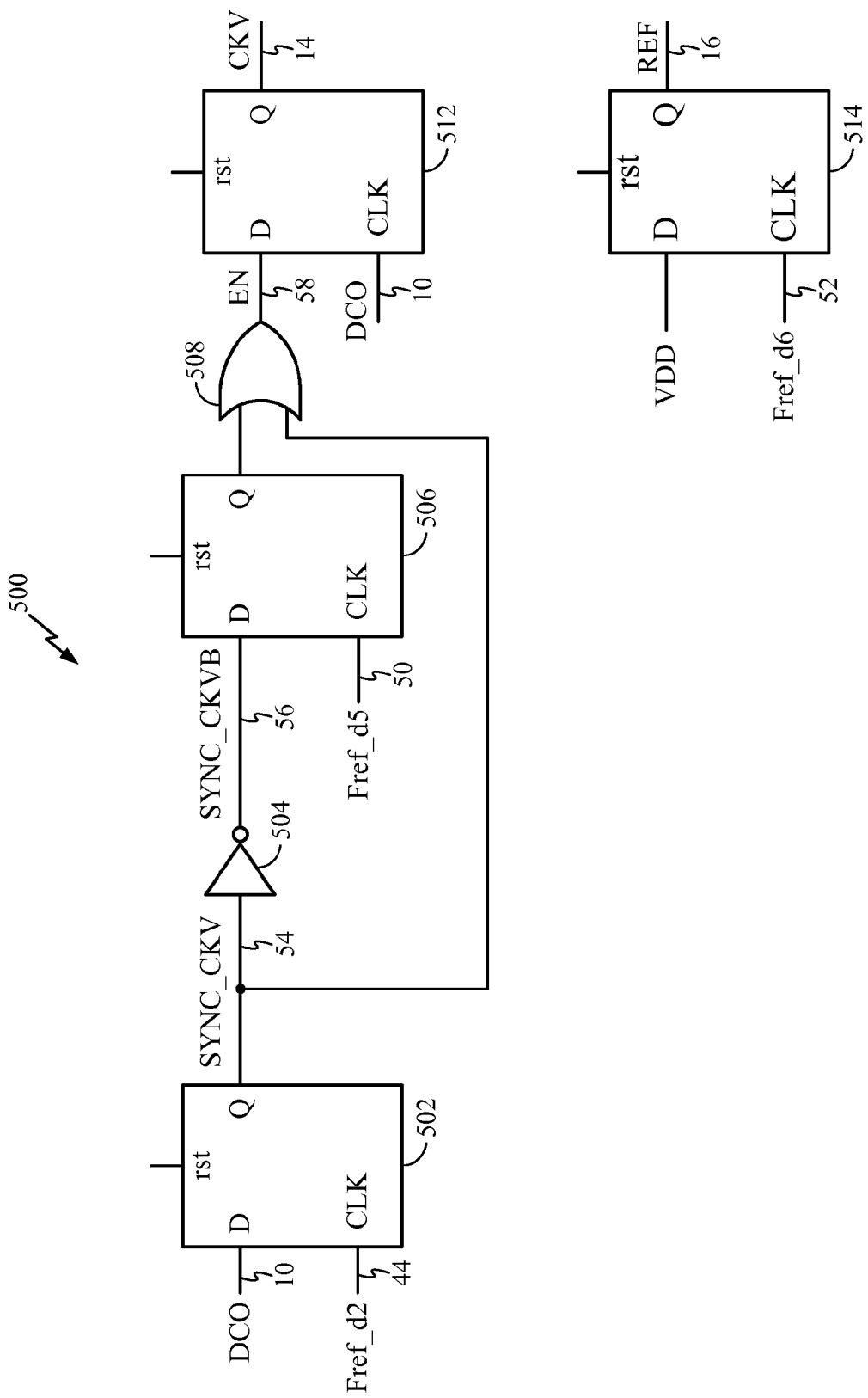
FIG. 7A is a block diagram of a logic circuit disposed in the edge detector of FIG. 1, in accordance with one exemplary embodiment of the present invention.

FIGS. 6A and 7A together are a schematic diagram of edge detector 100 of FIG. 1, in accordance with one embodiment of the present invention. FIG. 6A is a schematic diagram of an adjustable delay chain 450 adapted to generate a multitude of phases of clock signal Fref 12. FIG. 7A is a block diagram of a logic circuit 500 adapted to generate signals CKV 14 and REF 16.

As is seen in FIG. 6A, delay chain 450 is shown as including a delay-locked loop 440, a multitude of buffers 404, 406, 408, 410, 412, 414, and a multitude of variable capacitors 424, 426, 428, 430, 432, 434 disposed between the buffers. The capacitances of the variable capacitors may be varied using delay-locked loop 440 such that the delay across any of the buffers having variable capacitors at its input and output terminals is one-quarter of the period of signal DCO 10. Accordingly, the delay across buffers 406, 408, 410, 412, and 414 is one-quarter of the period of signal DCO 10. FIG. 6B is a timing diagram of signal Fref 12 and each of the delay signals Fref_d1 42, Fref_d2 44, Fref_d3 46, Fref_d4 48, Fref_d5 50, and Fref_d6 52 generated by delay chain 450. As is seen, the delay across each buffer is one-quarter of the period of signal DCO 10.

Referring to FIG. 7A, logic circuit 500 includes flip-flops 502, 506, 512, 514, inverter 504, and OR gate 508. During each period of signal FREF 12, logic circuit 500 filters out all transition (edges) of signal DCO 10 except the DCO 10 edge detected as being closest in time to the transition of signal FREF 12. The DCO 10 edge so detected is supplied as output signal CKV 14. The corresponding edge of signal FREF 12 is supplied as output signal REF 16.

Figure 7B:
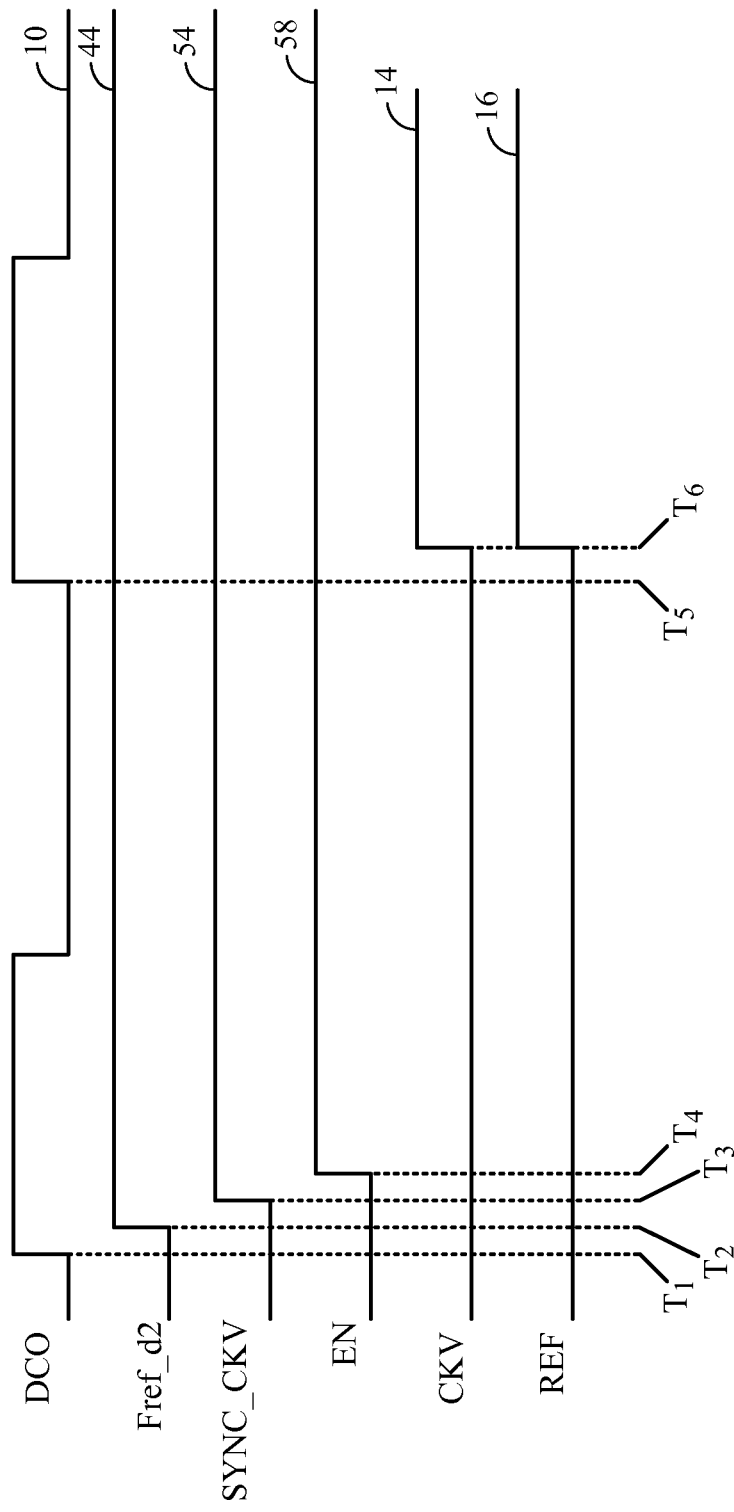
FIGS. 7B and 7C are timing diagrams of a number of signals associated with the logic circuit of FIG. 6A.

Signals Fref_d2 44 and DCO 10 are respectively applied to the clock and data input terminals of flip-flop 502. Assume signal DCO 10 leads signal Fref_d2 44, as shown in FIG. 7B. Accordingly, on the rising edge of signal Fref_d2 44, the output signal of flip-flop 502, namely signal SYNC_CKV 54, makes a low-to-high transition (i.e., goes high), in turn causing the output of OR gate 508, namely signal EN 58 to go high. Because signals EN 58 and DCO 10 are respectively applied to the data and clock input terminals of flip-flop 512, on the next rising edge of signal DCO 10, signal CKV 14 goes high. Furthermore, because signals VDD and Fref_d6 52 are respectively applied to the data and clock input terminals of flip-flop 514, on the next rising edge of signal Fref_d6 52, signal REF 16 goes high. Moreover, because signals Fref_d2 44 and Fref_d6 52 are one DCO 10 period apart, signal REF 16 is asserted after substantially one period of signal DCO 10. Signal SYNC_CKVB 56 is the inverse of signal SYNC_CKV 54. Accordingly, when signal SYNC_CKV 54 is high, on the next rising edge of signal Fref_d5 50, output Q of flip-flop 506 goes low. Subsequently, when signal SYNC_CKV 54 goes low, signal EN also goes low until the next transition of signal Fref_d5 50 is received.

FIG. 7B is a timing diagram of a number of signals associated with logic block 500 when signal DCO 10 is assumed to lead signal Fref_d2 44 n phase. Signals DCO 10 and Fref_d2 44 are shown as being asserted respectively at times T1 and T2, with T1 occurring prior T2. Signals SYNC_CKV 54 and EN 58 are asserted at times T3, and T4, reflecting the delays across flip-flop 502 and OR logic 508. The next rising edge of signal DCO 10 occurs at time T5. At time T6, signals CKV 14 and REF 16 are asserted reflecting the delays across flip-flops 510, and 512.

Figure 7C:
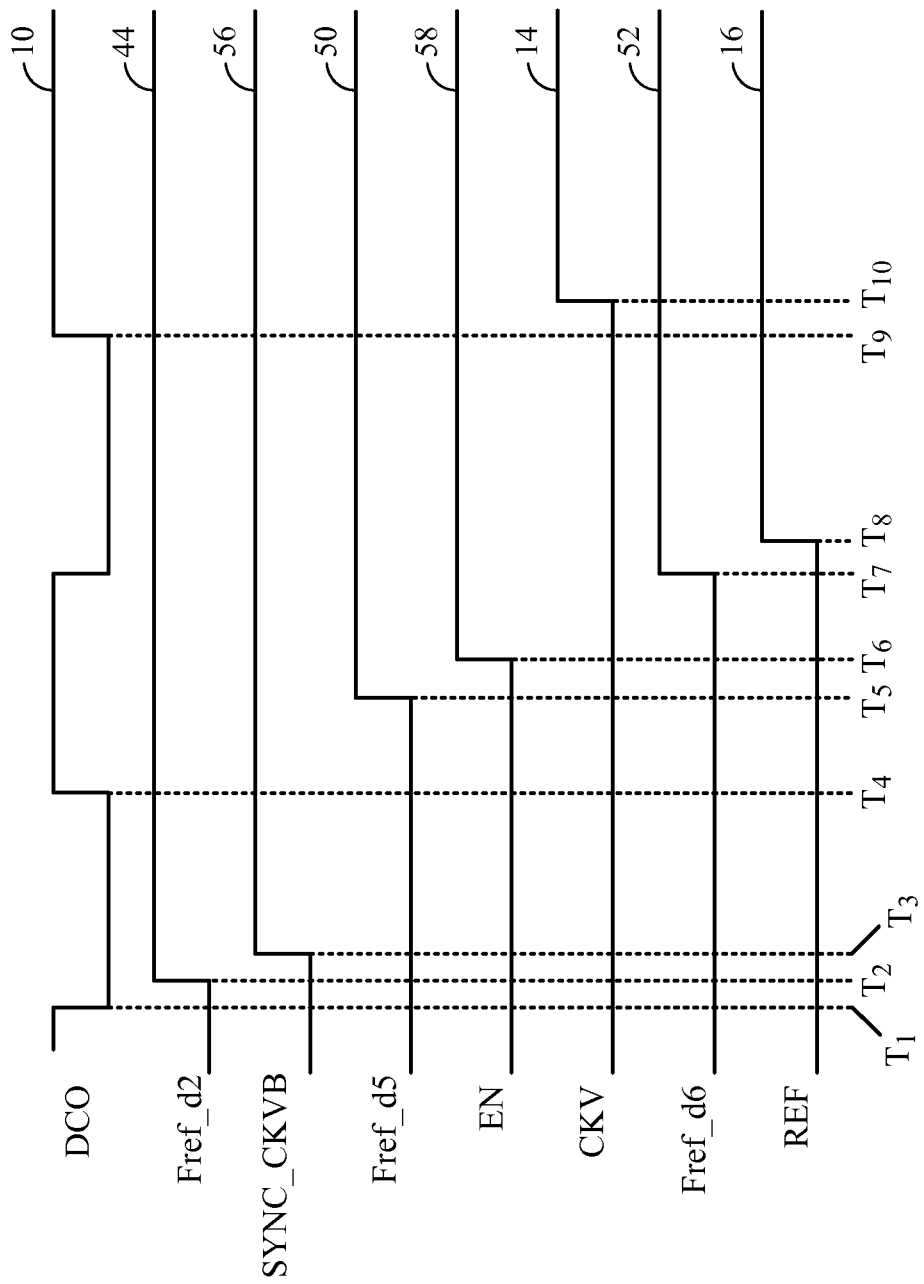

FIG. 7C is a timing diagram of a number of signals associated with logic circuit 500 when signal CKV 14 is assumed to lag signal Fref_d2 44 in phase. At time T1 signal DCO 10 is assumed to go low. At time T2 signal Fref_d2 44 is asserted, thereby causing signal SYNC_CKVB 56 to go high at T3. At time T4 signal DCO 10 is shown as going high. At time T6, which is ¾ of the period of signal DCO 10 after time T2, signal Fref_d5 50 goes high, thereby causing signal EN 58 to go high at T6. At time T7, which is one period of signal DCO 10 after time T2, signal FREF_d6 52 goes high, in turn causing signal REF 16 to go high at time T8, where (T8-T7) reflects the delay across flip-flop 510. At time T9, signal DCO 10 goes high, in turn causing signal CKV 14 to go high at time T10, where (T10-T9) reflects the delay across flip-flop 512. Accordingly, during each period of signal FREF 12, two signal edges are generated, namely an edge associated with signal FREF 12 and supplied as signal REF 16, and a corresponding edge of signal DCO 10 detected as being closest to the edge of signal FREF 12, and supplied as signal CKV 14. The time delay between the edges of signals REF 16 and CKV 14 is converted to a voltage by the time-to-voltage converter, and thereafter converted to a digital signal by the ADC, as described in detail above.

Figure 8:
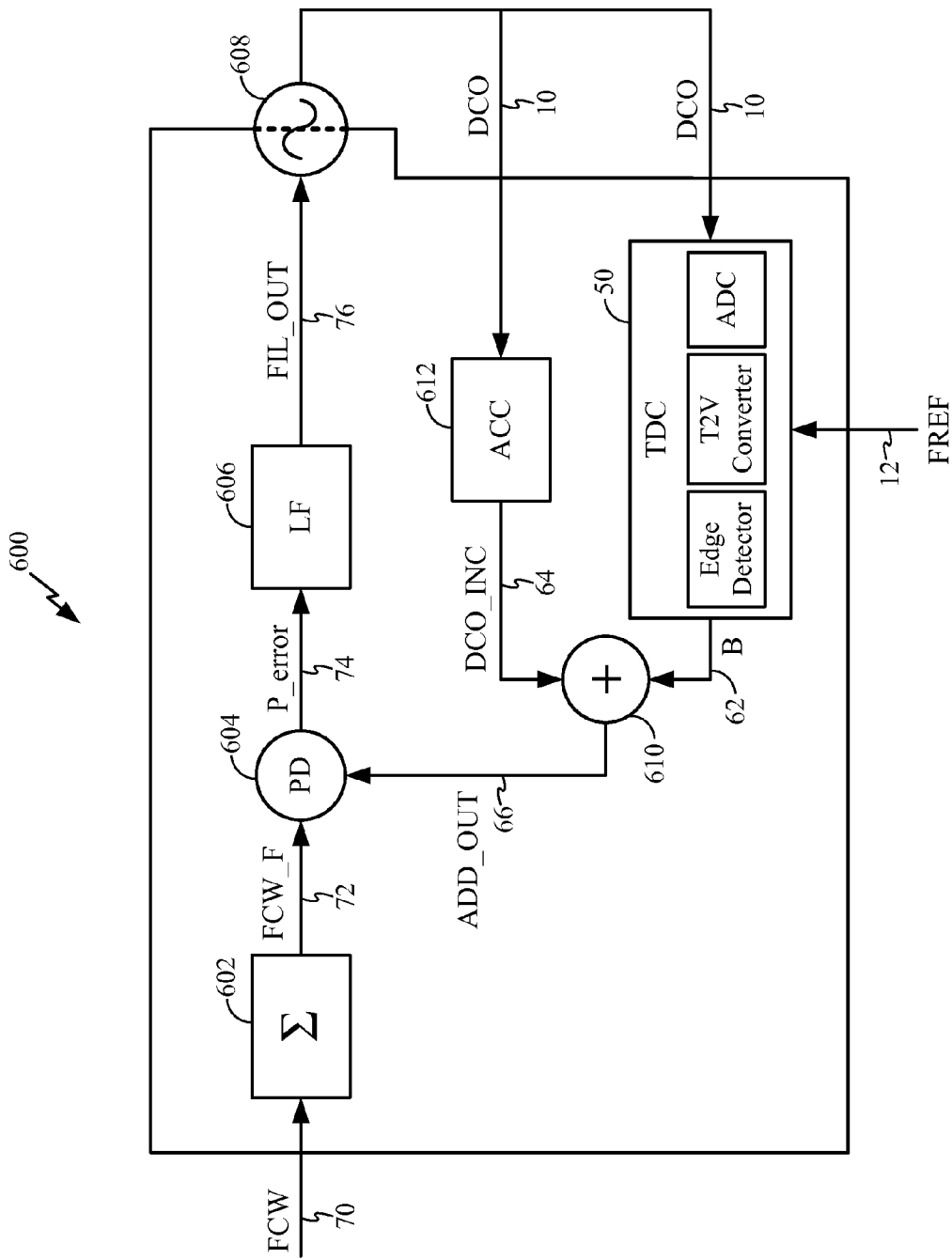
FIG. 8 is a block diagram of a digital phase-locked loop embodying a time-to-digital converter, in accordance with one embodiment of the present invention.

FIG. 8 is a block diagram of a digital phase-locked loop (PLL) 600 embodying a TDC, in accordance with one embodiment of the present invention. Digitally-controlled oscillator 608 generates a DCO 10 signal having a multitude of transitions during each period of reference clock signal FREF 12. As described above, TDC 50 is adapted to detect the DCO 10 edge that is closest in time to the edge of signal FREF 12, and to generate in response a differential signal B 62 whose value is proportional to the timing difference between these two edges.

Accumulator 612 is adapted to increment the DCO 10 value by one with each cycle of the clock thereby to generate a signal DCO_INC 64. Adder 610 sums the output values of TDC 50 and accumulator 612 to generate signal ADD_OUT 66 applied to phase detector 604. Delta-Sigma modulator 602, which receives the frequency control word (FCW) 70, is adapted to provide a finer PLL frequency resolution signal FCW_F 72 thereby to avoid the use of many control bits, and further to reduce the generation of spur.

Phase detector 604 is adapted to detect the difference between the signal value supplied by adder 610, namely ADD_OUT 66, and the signal value supplied by delta-sigma modulator 602, namely signal FCW_F to generate a phase error signal P_Error 74. Loop filter 606 is a low-pass filter adapted to filter out the high frequency components of the noise from signal P_Error and supply the filtered signal FIL_OUT 76 to DCO 608. The phase of the oscillating signal DCO 10 generated by digitally-controlled oscillator 608 is varied in accordance with the filtered signal it receives from loop-filter 606 so as to lock the phase of signal DCO 10 to the phase of signal FREF 12. Although not shown, it is understood that a TDC, in accordance with embodiments of the present invention, may be used in any other controlled-loop circuitry, such as frequency-locked loop, phase/frequency locked loop, and the like.

Figure 9:
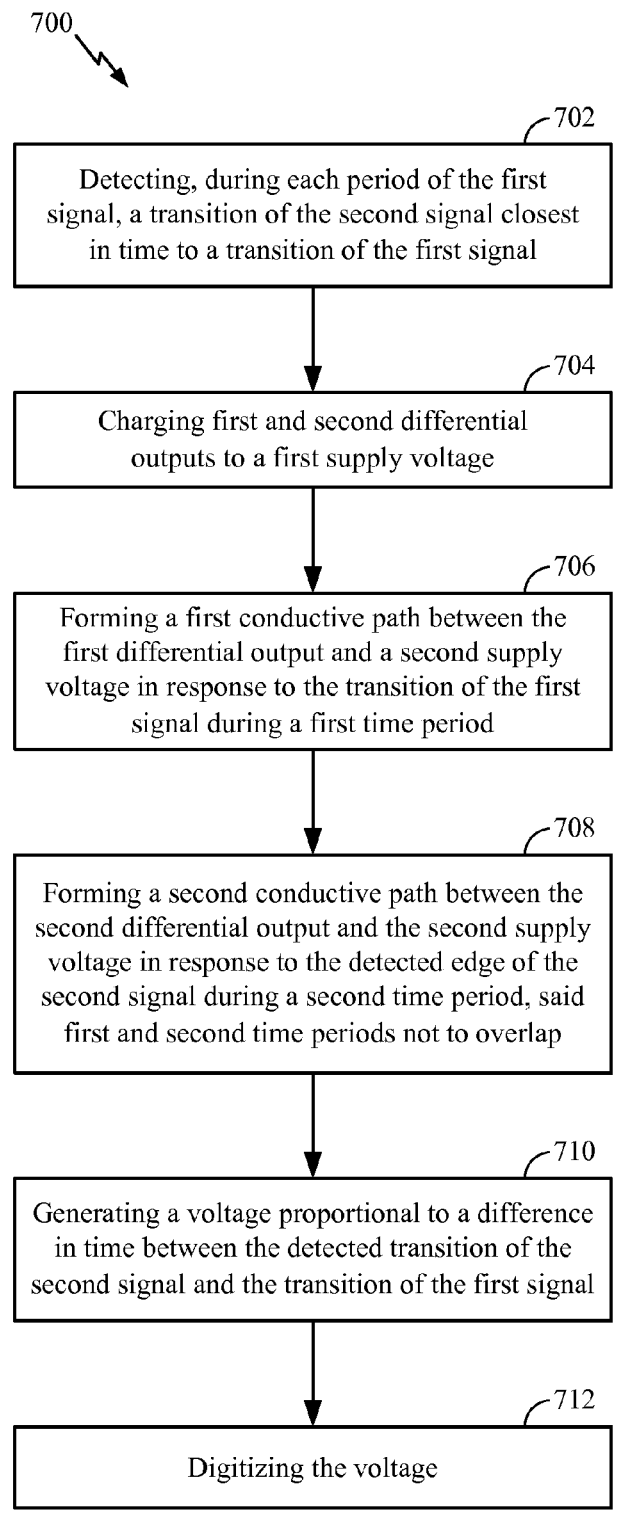
FIG. 9 shows a flowchart or converting the difference between the transition times of a pair of signals to a digital voltage, in accordance with one embodiment of the present invention.

FIG. 9 is a flowchart 700 for converting the difference between the transition times of first and second signals to a digital voltage, in accordance with one embodiment of the present invention. To achieve this, during each period of the first signal, a transition of the second signal that is closest in time to the transition of the first signal is detected 702. First and second differential outputs are charged 704 to a first supply voltage. Thereafter, a first conductive path is formed 706 between the first differential output and a second supply voltage in response to the transition of the first signal during a first time period, thereby enabling the first differential output to vary. A second conductive path is formed 708 between the second differential output and the second supply voltage in response to the detected edge of the second signal during a second time period, thereby enabling the second differential output to vary. The first and second time periods do not to overlap. Thereafter, a voltage proportional to the difference in time between the detected transition of the second signal and the transition of the first signal is generated 710 and digitized 712.

The above embodiments of the present invention are illustrative and not limitative. For example, embodiments of the present invention are not limited by the type of edge detector, time-to-voltage converter, analog-to-digital converter, buffer, or flip-flop used to convert the difference between the arrival times of two signals to a digital signal. Embodiments of the present invention are not limited by the type of device, wireless or otherwise, in which they may be disposed. Although the above embodiments of the present invention are described with reference to circuits using differential signals, it is understood that embodiments of the present invention are equally applicable to circuit using single-ended signals. The embodiments of the present invention are not limited by the type of the technology, CMOS, Bipolar, BICMOS or otherwise, that may be used to from the time-to-digital converter. Other additions, subtractions or modification are obvious in view of the present invention and are intended to fall within the scope of the appended claims.

What is claimed is:

1. A time-to-digital converter comprising:
an edge detector responsive to first and second signals, said second signal comprising a plurality of edges during each period of the first signal, said edge detector adapted to detect, during each period of the first signal, an edge of the second signal that is closest to an edge of the first signal;
a time-to-voltage converter adapted to generate a voltage proportional to a difference in time between the detected edge of the second signal and the edge of the first signal, wherein the time-to-digital converter has first and second differential outputs adapted to be charged to a predefined voltage level in response to a reset signal, wherein a first conductive path is formed between the first differential output and a first supply voltage in response to the edge of the first signal during a first time period, and wherein a second conductive path is formed between the second differential output and the first supply voltage in response to the detected edge of the second signal during a second time period, said first and second time periods not to overlap; and an analog-to-digital converter adapted to digitize a difference in voltages of the first and second differential outputs.

2. The time-to-digital converter of claim 1 wherein said time-to-voltage converter further comprises:
first and second transistors adapted to provide the first conductive path between the first differential output and the first supply voltage; and
third and fourth transistors adapted to provide the second conductive path between the second differential output and the first supply voltage.

3. The time-to-digital converter of claim 2 wherein said time-to-voltage converter further comprises:
a fifth transistor adapted to charge the first differential output to the predefined voltage level; and
a sixth transistor adapted to charge the second differential output to the predefined voltage level, wherein the predefined voltage level is a second supply voltage.

4. The time-to-digital converter of claim 3 wherein said fifth and sixth transistors are NMOS transistors and wherein the second supply voltage is smaller than the first supply voltage.

5. The time-to-digital converter of claim 4 further comprising:
a first plurality of capacitors each adapted to be coupled between the first differential output and the second supply voltage in response to a different one of a first plurality of signals; and
a second plurality of capacitors each adapted to be coupled between the second differential output and the second supply voltage in response to a different one of a second plurality of signals.

6. The time-to-digital converter of claim 5 wherein the analog-to-digital converter is a successive approximation register (SAR) analog-to-digital converter, and wherein the first and second plurality of capacitors perform sample and hold operations for the analog-to-digital converter.

7. The time-to-digital converter of claim 6 wherein said analog-to-digital converter further comprises a control logic adapted to generate the first and second plurality of signals.

8. The time-to-digital converter of claim 7 wherein said analog-to-digital converter further comprises a comparator adapted to compare voltages of the first and second differential outputs of the time-to-voltage converter and supply a comparison signal to the control logic.

9. The time-to-digital converter of claim 8 wherein said edge detector comprises a plurality of buffers and variable capacitors, wherein the delay across each of a subset of the plurality of buffers is adjusted to a predefined fraction of a period of the second signal by varying the capacitances of a subset of the plurality of variable capacitors.

10. The time-to-digital converter of claim 8 wherein said edge detector further comprises a plurality of flip-flops having a plurality of clock input terminals driven by a plurality of output signals of the plurality of buffers.

11. A method of converting a difference between transition times of a first signal and a second signal to a digital signal, said second signal comprising a plurality of transitions during each period of the first signal, the method comprising:
detecting, during each period of the first signal, a transition of the second signal closest in time to a transition of the first signal;
charging first and second differential outputs to a first supply voltage;

forming a first conductive path between the first differential output and a second supply voltage in response to the transition of the first signal during a first time period;
forming a second conductive path between the second differential output and the second supply voltage in response to the detected transition of the second signal during a second time period, said first and second time periods not to overlap;
generating a voltage proportional to a difference in time between the detected transition of the second signal and the transition of the first signal; and
digitizing the voltage.

12. The method of claim 11 further comprising:
forming the first conductive path via first and second transistors; and
forming the second conductive path via third and fourth transistors.

13. The method of claim 12 further comprising:
charging the first differential output to the first supply voltage via a fifth transistor; and
charging the second differential output to the first supply voltage via a sixth transistor.

14. The method of claim 13 wherein said fifth and sixth transistors are NMOS transistors and wherein the second supply voltage is greater than the first supply voltage.

15. The method of claim 14 further comprising:
forming a first plurality of capacitors each adapted to be coupled between the first differential output and the second supply voltage in response to a different one of a first plurality of signals; and
forming a second plurality of capacitors each adapted to be coupled between the second differential output and the second supply voltage in response to a different one of a second plurality of signals.

16. The method of claim 15 further comprising:
digitizing the difference in voltages of the first and second differential outputs using a successive approximation register (SAR) analog-to-digital converter; and
performing sample and hold operations using the first and second plurality of capacitors.

17. The method of claim 16 further comprising:
generating the first and second plurality of signals using a control logic disposed in the SAR analog-to-digital converter.

18. The method of claim 17 further comprising:
comparing voltages of the first and second differential outputs to generate a comparison signal; and
delivering the comparison signal to the control logic.

19. The method of claim 18 further comprising:
forming a plurality of buffers in series;
disposing a plurality of variable capacitors at outputs of the plurality of buffers;
applying the first signal to an input of a first one of the plurality of buffers; and
varying capacitances of the plurality of variable capacitors such that a delay across each of a subset of the plurality of buffers is adjusted to a predefined fraction of a period of the second signal.

20. The method of claim 19 further comprising:
detecting the transition of the second signal closest in time to the transition of the first signal by using a plurality of flip-flops having a plurality of clock input terminals driven by a plurality of output signals of the plurality of buffers.

21. A non-transitory computer readable storage medium comprising instructions configured to convert a difference between transition times of a first signal and a second signal to a time, said second signal comprising a plurality of transitions during each period of the first signal, said instructions when executed by a processor cause the processor to:

detect, during each period of the first signal, a transition of the second signal closest in time to a transition of the first signal;

charge first and second differential outputs to a first supply voltage;

form a first conductive path between the first differential output and a second supply voltage in response to the transition of the first signal during a first time period;

form a second conductive path between the second differential output and the second supply voltage in response to the detected transition of the second signal during a second time period, said first and second time periods not to overlap;

generate a voltage proportional to a difference in time between the detected transition of the second signal and the transition of the first signal; and digitize a difference in voltages of the first and second differential outputs.

22. The non-transitory computer readable storage medium of claim 21 wherein said instructions further cause the processor to:

form the first conductive path via first and second transistors; and form the second conductive path via third and fourth transistors.

23. The non-transitory computer readable storage medium of claim 22 wherein said instructions further cause the processor to:

charge the first differential output to the first supply voltage via a fifth transistor; and charge the second differential output to the first supply voltage via a sixth transistor.

24. The non-transitory computer readable storage medium of claim 23 wherein said fifth and sixth transistors are NMOS transistors and wherein the second supply voltage is greater than the first supply voltage.

25. The non-transitory computer readable storage medium of claim 24 wherein said instructions further cause the processor to:

form a first plurality of capacitors each adapted to be coupled between the first differential output and the second supply voltage in response to a different one of a first plurality of signals; and form a second plurality of capacitors each adapted to be coupled between the second differential output and the second supply voltage in response to a different one of a second plurality of signals.

26. The non-transitory computer readable storage medium of claim 25 wherein said instructions further cause the processor to:

digitize the difference in voltages of the first and second differential outputs using a successive approximation register (SAR) analog-to-digital converter; and perform sample and hold operations using the first and second plurality of capacitors.

27. The non-transitory computer readable storage medium of claim 26 wherein said instructions further cause the processor to:

generate the first and second plurality of signals using a control logic disposed in the SAR analog-to-digital converter.

28. The non-transitory computer readable storage medium of claim 27 wherein said instructions further cause the processor to:

compare voltages of the first and second differential outputs to generate a comparison signal; and deliver the comparison signal to the control logic.

29. The non-transitory computer readable storage medium of claim 28 wherein said instructions further cause the processor to:

form a plurality of buffers in series;

dispose a plurality of variable capacitors at outputs of the plurality of buffers;

apply the first signal to an input of a first one of the plurality of buffers; and vary capacitances of the plurality of variable capacitors such that a delay across each of a subset of the plurality of buffers is adjusted to a predefined fraction of a period of the second signal.

30. The non-transitory computer readable storage medium of claim 29 wherein said instructions further cause the processor to:

detect the transition of the second signal closest in time to the transition of the first signal by using a plurality of flip-flops having a plurality of clock input terminals driven by a plurality of output signals of the plurality of buffers.

31. A time-to-digital converter adapted to convert a difference between transition times of a first signal and a second signal to a time, said second signal comprising a plurality of transitions during each period of the first signal, the time-to-digital converter comprising:

means for detecting, during each period of the first signal, a transition of the second signal closest in time to a transition of the first signal;

means for charging first and second differential outputs to a first supply voltage;

means for forming a first conductive path between the first differential output and a second supply voltage in response to the transition of the first signal during a first time period;

means for forming a second conductive path between the second differential output and the second supply voltage in response to the detected transition of the second signal during a second time period, said first and second time periods not to overlap;

means for generating a voltage proportional to a difference in time between the detected transition of the second signal and the transition of the first signal; and means for digitizing a difference in voltages of the first and second differential outputs.

32. The time-to-digital converter of claim 31 further comprising:

means for forming the first conductive path via first and second transistors; and means for forming the second conductive path via third and fourth transistors.

33. The time-to-digital converter of claim 32 further comprising:

means for charging the first differential output to the first supply voltage via a fifth transistor; and means for charging the second differential output to the first supply voltage via a sixth transistor.

34. The time-to-digital converter of claim 33 wherein said fifth and sixth transistors are NMOS transistors and wherein the second supply voltage is greater than the first supply voltage.

35. The time-to-digital converter of claim 34 further comprising:

a first plurality of capacitors each adapted to be coupled between the first differential output and the second supply voltage in response to a different one of a first plurality of signals; and a second plurality of capacitors each adapted to be coupled between the second differential output and the second supply voltage in response to a different one of a second plurality of signals.

36. The time-to-digital converter of claim 35 wherein said means for digitizing the difference in voltages of the first and second differential outputs is a successive approximation register (SAR) analog-to-digital converter, wherein the time-to-digital converter further comprises:

means for performing sample and hold operations using the first and second plurality of capacitors.

37. The time-to-digital converter of claim 36 wherein said means for generating the first and second plurality of signals is a control logic disposed in the SAR analog-to-digital converter.

38. The time-to-digital converter of claim 37 further comprising:

means for comparing voltages of the first and second differential outputs to generate a comparison signal; and means for delivering the comparison signal to the control logic.

39. The time-to-digital converter of claim 38 further comprising:

a plurality of buffers in series;

a plurality of variable capacitors each coupled to an output of a different one of a plurality of buffers; and means for varying capacitances of the plurality of variable capacitors such that a delay across each of a subset of the plurality of buffers is a predefined fraction of a period of the second signal.

40. The time-to-digital converter of claim 39 wherein the means for detecting the transition of the second signal closest in time to the transition of the first signal comprises a plurality of flip-flops having a plurality of clock input terminals driven by a plurality of output signals of the plurality of buffers.

41. A digital control-locked loop comprising:

a detector adapted to detect a difference between a control signal and a loop signal to generate an error signal;

a loop filter adapted to filter out high frequency components of noise from the error signal;

a digitally-controlled oscillator adapted to generate an oscillating signal responsive to the filtered error signal; and a time-to-digital converter comprising:

an edge detector responsive to a reference clock signal and the oscillating signal, said oscillating signal comprising a plurality of edges during each period of the reference clock signal, said edge detector adapted to detect, during each period of the reference clock signal, an edge of the oscillating signal that is closest to an edge of the reference clock signal;

a time-to-voltage converter adapted to generate a voltage proportional to a difference in time between the detected edge of the oscillating signal and the edge of the reference clock signal; and an analog-to-digital converter adapted to digitize the voltage generated by the time-to-voltage converter, said digitized voltage defining the loop signal.

42. The digital control-locked loop of claim 41 wherein said time-to-voltage converter further comprises:

first and second transistors adapted to provide a first conductive path between a first differential output of the time-to-voltage converter and a first supply voltage; and third and fourth transistors adapted to provide a second conductive path between a second differential output of the time-to-voltage converter and the first supply voltage.

43. The digital control-locked loop of claim 42 wherein said time-to-voltage converter further comprises:

a fifth transistor adapted to reset the first differential output to a second supply voltage; and a sixth transistor adapted to reset the second differential output to the second supply voltage.

44. The digital control-locked loop of claim 43 wherein said fifth and sixth transistors are NMOS transistors and wherein the second supply voltage is smaller than the first supply voltage.

45. The digital control-locked loop of claim 44 further comprising:

a first plurality of capacitors each adapted to be coupled between the first differential output and the second supply voltage in response to a different one of a first plurality of signals; and a second plurality of capacitors each adapted to be coupled between the second differential output and the second supply voltage in response to a different one of a second plurality of signals.

46. The digital control-locked loop of claim 45 wherein the analog-to-digital converter is a successive approximation register (SAR) analog-to-digital converter, and wherein the first and second plurality of capacitors perform sample and hold operations for the analog-to-digital converter.

47. The digital control-locked loop of claim 46 wherein said analog-to-digital converter further comprises a control logic adapted to generate the first and second plurality of signals.

48. The digital control-locked loop of claim 47 wherein said analog-to-digital converter further comprises a comparator adapted to compare voltages of the first and second differential outputs of the time-to-voltage converter and supply a comparison signal to the control logic.

49. The digital control-locked loop of claim 48 wherein said edge detector comprises a plurality of buffers and variable capacitors, wherein the delay across each of the plurality of buffers is a predefined fraction of a period of the oscillating signal.

50. The digital control-locked loop of claim 49 wherein said edge detector further comprises a plurality of flip-flops having a plurality of clock input terminals driven by a plurality of output signals of the plurality of buffers.

51. A method of locking an oscillating signal to a reference clock signal, said oscillating signal comprising a plurality of transitions during each period of the reference clock signal, the method comprising:

detecting a difference between a control signal and a loop signal to generate an error signal;

filtering out high frequency components of the error signal;

generating the oscillating signal in response to the filtered error signal;

detecting, during each period of the reference signal, a transition of the oscillating signal closest in time to a transition of the reference clock signal;

charging first and second differential outputs to a first supply voltage;

forming a first conductive path between the first differential output and a second supply voltage in response to the transition of the reference clock signal during a first time period;

forming a second conductive path between the second differential output and the second supply voltage in response to the detected transition of the oscillating signal during a second time period, said first and second time periods not to overlap;
generating a voltage proportional to a difference in time between the detected transition of the oscillating signal and the transition of the reference clock signal; and
digitizing the voltage, said digitized voltage defining the loop signal.

52. The method of claim 51 further comprising:
forming the first conductive path via first and second transistors; and
forming the second conductive path via third and fourth transistors.

53. The method of claim 52 further comprising:
resetting the first differential output to the first supply voltage via a fifth transistor; and
resetting the second differential output to the first supply voltage via a sixth transistor.

54. The method of claim 53 wherein said fifth and sixth transistors are NMOS transistors and wherein the second supply voltage is greater than the first supply voltage.

55. The method of claim 54 further comprising:
forming a first plurality of capacitors each adapted to be coupled between the first differential output and the second supply voltage in response to a different one of a first plurality of signals; and
forming a second plurality of capacitors each adapted to be coupled between the second differential output and the second supply voltage in response to a different one of a second plurality of signals.

56. The method of claim 55 further comprising:
digitizing the difference in voltages of the first and second differential outputs using a successive approximation register (SAR) analog-to-digital converter; and
performing sample and hold operations using the first and second plurality of capacitors.

57. The method of claim 56 further comprising:
generating the first and second plurality of signals using a control logic disposed in the SAR analog-to-digital converter.

58. The method of claim 57 further comprising:
comparing voltages of the first and second differential outputs to generate a comparison signal; and
delivering the comparison signal to the control logic.

59. The method of claim 58 further comprising:
forming a plurality of buffers in series;
disposing a plurality of variable capacitors at outputs of the plurality of buffers;
applying the reference clock signal to an input of a first one of the plurality of buffers; and
varying capacitances of the plurality of variable capacitors such that a delay across each of a subset of the plurality of buffers is a predefined fraction of a period of the oscillating signal.

60. The method of claim 59 further comprising:
detecting the transition of the oscillating signal closest in time to the transition of the reference clock signal by using a plurality of flip-flops having a plurality of clock input terminals driven by a plurality of output signals of the plurality of buffers.

61. A non-transitory computer readable storage medium comprising instructions configured to lock an oscillating signal to a reference clock signal, said oscillating signal comprising a plurality of transitions during each period of the reference signal, said instructions when executed by a processor causing the processor to:

detect a difference between a control signal and a loop signal to generate an error signal;
filter out high frequency components of the error signal;
generate the oscillating signal in response to the filtered error signal;
detect, during each period of the reference clock signal, a transition of the oscillating signal closest in time to a transition of the reference clock signal;
charge first and second differential outputs to a first supply voltage;
form a first conductive path between the first differential output and a second supply voltage in response to the transition of the reference signal during a first time period;
form a second conductive path between the second differential output and the second supply voltage in response to the detected transition of the oscillating signal during a second time period, said first and second time periods not to overlap;
generate a voltage proportional to a difference in time between the detected transition of the oscillating signal and the transition of the reference clock signal; and
digitize a difference in voltages of the first and second differential outputs, said digitized difference defining the loop signal.

62. The non-transitory computer readable storage medium of claim 61 wherein said instructions further cause the processor to:
form the first conductive path via first and second transistors; and
form the second conductive path via third and fourth transistors.

63. The non-transitory computer readable storage medium of claim 62 wherein said instructions further cause the processor to:
reset the first differential output to the first supply voltage via a fifth transistor; and
reset the second differential output to the first supply voltage via a sixth transistor.

64. The non-transitory computer readable storage medium of claim 63 wherein said fifth and sixth transistors are NMOS transistors and wherein the second supply voltage is greater than the first supply voltage.

65. The non-transitory computer readable storage medium of claim 64 wherein said instructions further cause the processor to:
form a first plurality of capacitors each adapted to be coupled between the first differential output and the second supply voltage in response to a different one of a first plurality of signals; and
form a second plurality of capacitors each adapted to be coupled between the second differential output and the second supply voltage in response to a different one of a second plurality of signals.

66. The non-transitory computer readable storage medium of claim 65 wherein said instructions further cause the processor to:
digitize the difference in voltages of the first and second differential outputs using a successive approximation register (SAR) analog-to-digital converter; and
perform sample and hold operations using the first and second plurality of capacitors.

67. The non-transitory computer readable storage medium of claim 66 wherein said instructions further cause the processor to:

generate the first and second plurality of signals using a control logic disposed in the SAR analog-to-digital converter.

68. The non-transitory computer readable storage medium of claim 67 wherein said instructions further cause the processor to:
compare voltages of the first and second differential outputs to generate a comparison signal; and
deliver the comparison signal to the control logic.

69. The non-transitory computer readable storage medium of claim 68 wherein said instructions further cause the processor to:
form a plurality of buffers in series;
dispose a plurality of variable capacitors at outputs of the plurality of buffers; and
apply the reference clock signal to an input of a first one of the plurality of buffers; and
vary capacitances of the plurality of variable capacitors such that a delay across each of a subset of the plurality of buffers is a predefined fraction of a period of the oscillating signal.

70. The non-transitory computer readable storage medium of claim 69 wherein said instructions further cause the processor to:
detect the transition of the oscillating signal closest in time to the transition of the reference clock signal by using a plurality of flip-flops having a plurality of clock input terminals driven by a plurality of output signals of the plurality of buffers.

71. A digital control-locked loop comprising:
means for detecting a difference between a control signal and a loop signal to generate an error signal;
means for filtering out high frequency components of noise from the error signal;
means for generating an oscillating signal in response to the filtered error signal;
means for detecting, during each period of a reference signal, a transition of the oscillating signal closest in time to a transition of a reference clock signal;
means for charging first and second differential outputs to a first supply voltage;
means for forming a first conductive path between the first differential output and a second supply voltage in response to the transition of the reference clock signal during a first time period;
means for forming a second conductive path between the second differential output and the second supply voltage in response to the detected transition of the oscillating signal during a second time period, said first and second time periods not to overlap;
means for generating a voltage proportional to a difference in time between the detected transition of the oscillating signal and the transition of the reference clock signal; and
means for digitizing a difference in voltages of the first and second differential outputs, said digitized difference defining the loop signal.

72. The digital control-locked loop of claim 71 further comprising:

means for forming the first conductive path via first and second transistors; and
means for forming the second conductive path via third and fourth transistors.

73. The digital control-locked loop of claim 71 further comprising:
means for resetting the first differential output to the first supply voltage via a fifth transistor; and
means for resetting the second differential output to the first supply voltage via a sixth transistor.

74. The digital control-locked loop of claim 73 wherein said fifth and sixth transistors are NMOS transistors and wherein the second supply voltage is greater than the first supply voltage.

75. The digital control-locked loop of claim 74 further comprising:
a first plurality of capacitors each adapted to be coupled between the first differential output and the second supply voltage in response to a different one of a first plurality of signals; and
a second plurality of capacitors each adapted to be coupled between the second differential output and the second supply voltage in response to a different one of a second plurality of signals.

76. The digital control-locked loop of claim 75 wherein said means for digitizing the difference in voltages of the first and second differential outputs is a successive approximation register (SAR) analog-to-digital converter, wherein the time-to-digital converter further comprises:
means for performing sample and hold operations using the first and second plurality of capacitors.

77. The digital control-locked loop of claim 76 wherein said means for generating the first and second plurality of signals is a control logic disposed in the SAR analog-to-digital converter.

78. The digital control-locked loop of claim 77 further comprising:
means for comparing voltages of the first and second differential outputs to generate a comparison signal; and
means for delivering the comparison signal to the control logic.

79. The digital control-locked loop of claim 78 further comprising:
a plurality of buffers in series;
a plurality of variable capacitors each coupled to an output of a different one of the plurality of buffers; and
means for varying capacitances of the plurality of variable capacitors such that a delay across each of a subset of the plurality of buffers is a predefined fraction of a period of the oscillating signal.

80. The digital control-locked loop of claim 79 wherein the means for detecting the transition of the oscillating signal closest in time to the transition of the reference clock signal comprises a plurality of flip-flops having a plurality of clock input terminals driven by a plurality of output signals of the plurality of buffers.

* * * * *